United States Patent [19]

Porro et al.

[11] 4,313,056
[45] Jan. 26, 1982

[54] SCANNING ELECTRON MICROSCOPE WITH A CHAMBER WHICH CAN BE BROKEN DOWN, PARTICULARLY FOR OBSERVING PIECES OF RELATIVELY LARGE DIMENSIONS

[75] Inventors: Francesco Porro, Gallarate; Cosimo Gabriele, Busto Arsizio, both of Italy; Walter Hotz, Beringen, Switzerland

[73] Assignee: Costruzioni Aeronautiche Giovanni Agusta S.p.A., Cascina Costa Di Samarate, Italy

[21] Appl. No.: 154,224

[22] Filed: May 29, 1980

[30] Foreign Application Priority Data

Jun. 12, 1979 [IT] Italy .............................. 68260 A/79

[51] Int. Cl.³ .............................................. G21K 5/10
[52] U.S. Cl. .................................... 250/442; 250/441
[58] Field of Search ............... 250/435, 440, 441, 442, 250/457, 310, 311, 453

[56] References Cited

U.S. PATENT DOCUMENTS 408,830  5/1943  Borries et al. ..................... 250/440
2,627,580  2/1953  Picard ................................. 250/457

Primary Examiner—Bruce C. Anderson
Attorney, Agent, or Firm—Kane, Dalsimer, Kane, Sullivan and Kurucz

[57] ABSTRACT

An electron microscope including a base, a frame supported by said base, a vacuum chamber supported by said frame and including a fixed cup-shaped member having a lateral aperture closed by a movable cover, the latter including a further interchangeable cup-shaped member with its concavity facing said aperture, and supported by substantially horizontal guide means rigid with said frame for moving from and towards said fixed cup-shaped member; support means being provided inside said further cup-shaped member for supporting a piece holder in an adjustable position.

6 Claims, 4 Drawing Figures

SCANNING ELECTRON MICROSCOPE WITH A CHAMBER WHICH CAN BE BROKEN DOWN, PARTICULARLY FOR OBSERVING PIECES OF RELATIVELY LARGE DIMENSIONS

BACKGROUND OF THE INVENTION

This invention relates to a scanning electron microscope.

In particular, this invention relates to a scanning electron microscope in which a vacuum chamber is arranged to allow observation of pieces and/or details of relatively large dimensions, such as bearings and gears.

In scanning electron microscopes, it is known to use a vacuum chamber normally in the form of a cup-shaped body which comprises a lateral aperture for introducing the pieces to be examined, and which is disposed at the base of an electronic-optical column normally comprising a plurality of magnetic lenses arranged to focus and control an electron beam emitted by an emitter disposed inside said column.

In known vacuum chambers, said lateral aperture in the cup-shaped body is closed during observations, by a door arranged to cooperate in an air-tight manner, when in its closed position, with a flat surface of said cup-shaped body surrounding said lateral aperture. Said door is normally hinged to said cup-shaped body along one of its lateral edges, in such a manner as to be able to rotate about the vertical axis of a hinge normally provided on a plate removably connected to the cup-shaped body, and hinged to one side of said door.

In the known electron microscopes as heretofore described, the piece to be observed is normally connected to the inner surface of said door by means of a piece holder, which is normally able to enable the piece under examination to be moved from the outside along at least three axes in order to enable successive observation of a plurality of zones on the piece.

One of the most important drawbacks of the known electronic microscopes as heretofore described is that they allow pieces only of relatively small dimensions to be observed, as a large part of the free space inside the vacuum chamber is occupied by the piece holder, which generally projects in cantilever manner from the inner surface of the rotatable door. This drawback can obviously be solved by constructing chambers of greater volume. However, such a design would lead to generally high expense deriving not only from the greater chamber dimensions, but also from the greater complexity of the suction systems which generate the vacuum inside the chamber, and the solution of structural stability and air-tightness problems which arise as a result of using a rotatable door of obviously greater size, the hinge of which would be subjected to torsion stresses by the weight of the pieces under examination, and in particular by the weight of the piece holder.

SUMMARY OF THE INVENTION

The object of the present invention is to provide, at relatively low expense, an electron microscope which enables pieces of relatively large dimensions to be observed.

In particular, the object of the present invention is to enable said electron microscope to be derived directly from a known electron microscope by modifications which require no mechanical machining of the cup-shaped body which constitutes the fixed part of the vacuum chamber. In this respect, it should be noted that any vibration due to mechanically machining said cup-shaped body would necessarily require all the delicate devices carried by the electronic-optical column to be adjusted, thus involving not only considerable expense but in particular the impossibility of using the microscope for a relatively long period.

The object of the present invention is therefore to enable the capacity of the vacuum chamber of a known electron microscope to be modified at will without putting the microscope out of use for relatively long periods, and without making permanent modifications to said cup-shaped body which would render it unusable in its original form, and further without introducing any increase in stresses due to the increase in the weight of the pieces under examination and of the relative piece holder, and finally without incurring excessively high expense.

Said object is attained according to the present invention by an electron microscope comprising a base, a frame supported by said base by way of suspension means, a vacuum chamber supported by said frame and comprising a first fixed portion and a second portion mobile between a position in which said first portion is open and a position in which said first portion is closed, and an electronic-optical column rigidly connected to said first portion, this latter comprising a fixed cup-shaped body with a lateral aperture arranged to be closed by said second portion, characterized in that said second portion comprises a further interchangeable cup-shaped body with its concavity facing said aperture, and supported by substantially horizontal guide means rigid with said frame for moving from and towards said fixed cup-shaped body; support means being provided inside said further cup-shaped body for supporting a piece holder in an adjustable position.

BRIEF DESCRIPTION OF THE DRAWINGS

Further characteristics and advantages of the present invention will be apparent from the description given hereinafter with reference to the accompanying drawings, which illustrate one non-limiting embodiment thereof, and in which:

FIG. 1 shows an electron microscope indicated overall by 1 and comprising a fixed base 2 with an upperly open inner cavity 3, inside which there is housed a frame 4 supported by the base 2 by way of deformable suspension elements 5, which can for example be of the mechanical and/or pneumatic type.

DETAILED DESCRIPTION OF THE INVENTION

At its upper end, the frame 4 carries a table 6, to the upper surface of which, disposed above the base 2, there is connected a vacuum chamber 7 for the microscope 1.

Figure 3:
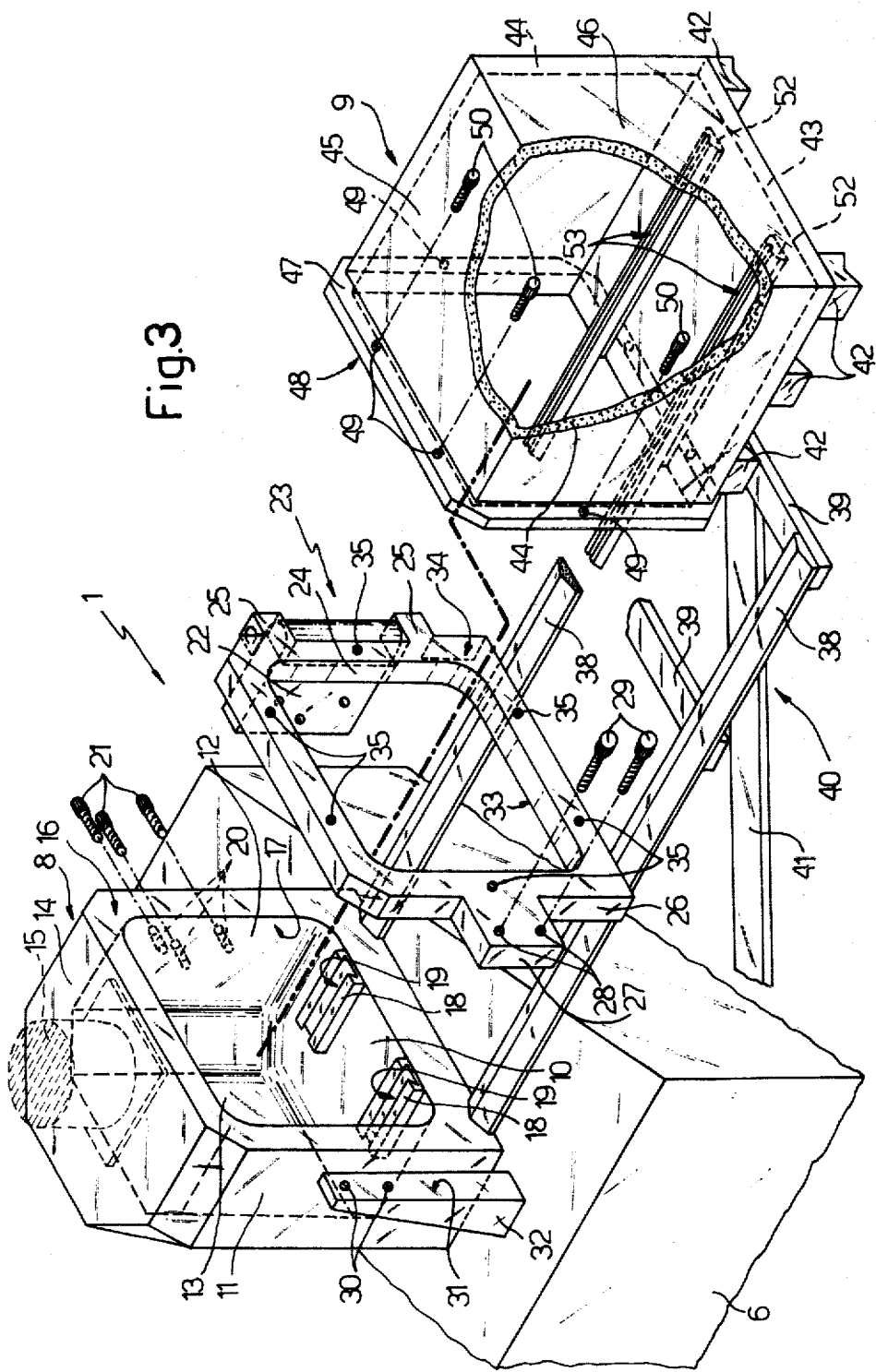
FIG. 3 is an exploded perspective view of the details shown in FIG. 2.

As shown in particular in FIG. 3, the chamber 7 is formed from a fixed part 8 and a mobile part 9, hereinafter indicated by the terms "fixed chamber" and "mobile chamber" respectively.

The fixed chamber 8 is of known type, and comprises a laterally open cup-shaped body substantially of horizontal axis, which is bounded by a lower wall 10 rigidly connected to the upper surface of the table 6, by two substantially vertical lateral walls 11 and 12, by a rear dished wall 13, and by a horizontal upper wall 14, on which an electronic-optical column 15 extends upwards.

The front end of the walls 10, 11, 12 and 13 defines a flat annular surface 16 disposed in a substantially vertical plane parallel to the axis of the column 15, and surrounding a lateral aperture 17, which is of substantially rectangular shape with rounded corners and allows access to the fixed chamber 8.

Two guides 18 are joined, preferably by gluing, to the upper surface of the lower wall 10, and comprise upperly a dovetail slot 19, and extend perpendicular to the plane of the surface 16.

In the outer surface of the lateral wall 12, there are provided three threaded blank bores 20, in each of which there is engaged a connection screw 21 for a substantially rectangular plate 22 projecting from the front of the surface 16.

In known electron microscopes, the plate 22 supports, hinged to it, a door (not shown) arranged to rotate about a vertical axis between an open position and a closed position, and cooperating in an air-tight manner with the surface 16 when in its closed position.

In the microscope 1 illustrated, instead of said door, the plate 22 supports hinged thereto a connection frame 23 of substantially rectangular shape, of which one vertical side 24 is provided externally with two appendices 25, between which the front end of the plate 22 is hinged, and a second vertical side 26 is provided externally with an appendix 27 comprising two through bores 28 engaged by respective screws 29. These latter emerge from the bores 28, and are arranged to engage in respective threaded bores 30 provided in a surface 31, coplanar with the surface 16, of an upright 32 extending upwards from the table 6 external to the wall 11.

Figure 4:
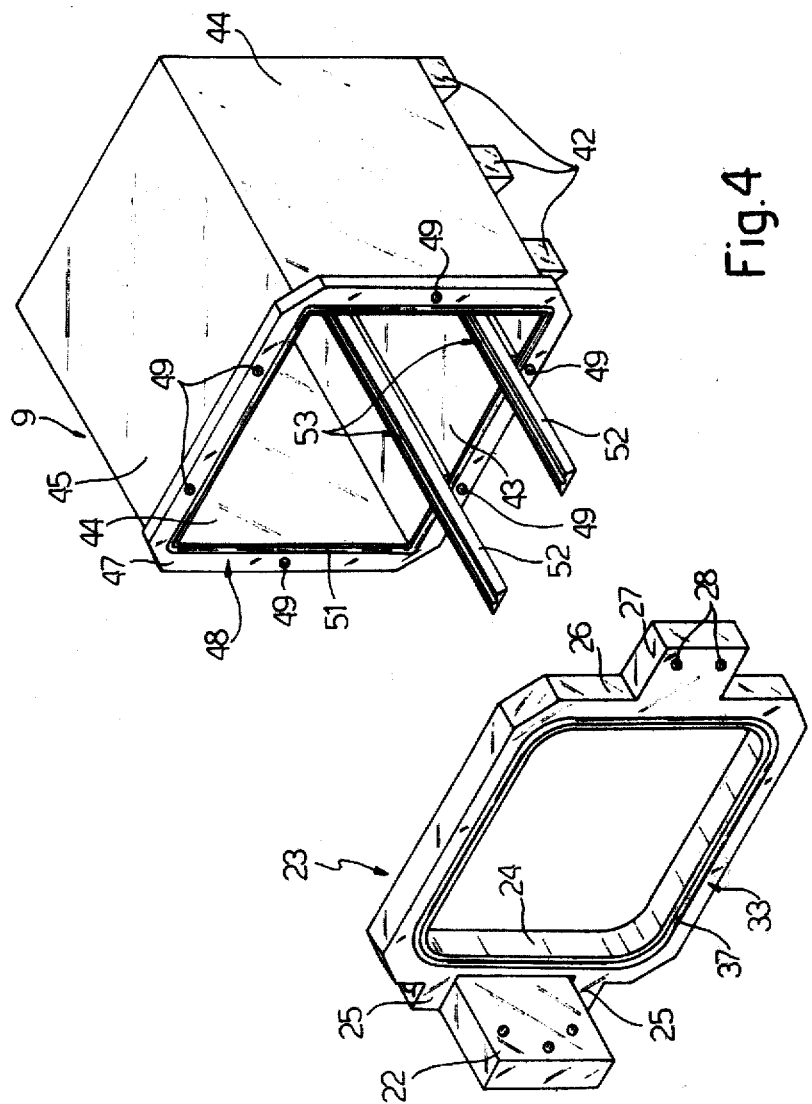
FIG. 4 is a further exploded perspective view of part of the details of FIG. 2.

The frame 23 is bounded on one side by a flat annular surface 33 (FIG. 4) substantially identical to the surface 16 and parallel thereto, and on the other side by a flat surface 34 (FIG. 3), which normally has a different shape from that of the surface 33, and is provided with a plurality of threaded dead bores 35 uniformly distributed along its periphery.

An annular groove is provided in the surface 33, and houses internally a seal gasket 37 which prevents air from passing between the surfaces 16 and 33 when the frame 23 is brought into contact with the fixed chamber 8 by rotation about the hinge carried by the plate 22.

Figure 1:
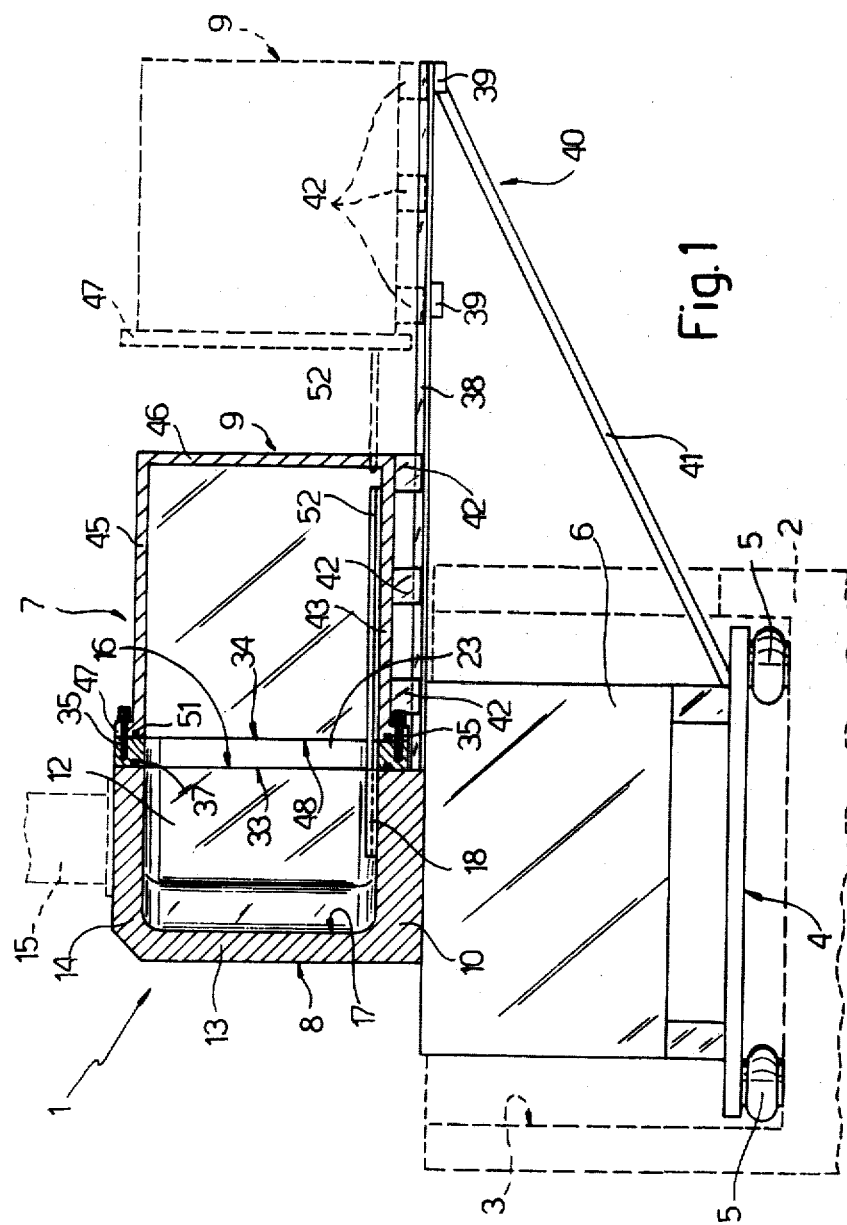
FIG. 1 is an axial section through the lower part of an electron microscope constructed in accordance with the present invention.
Figure 2:
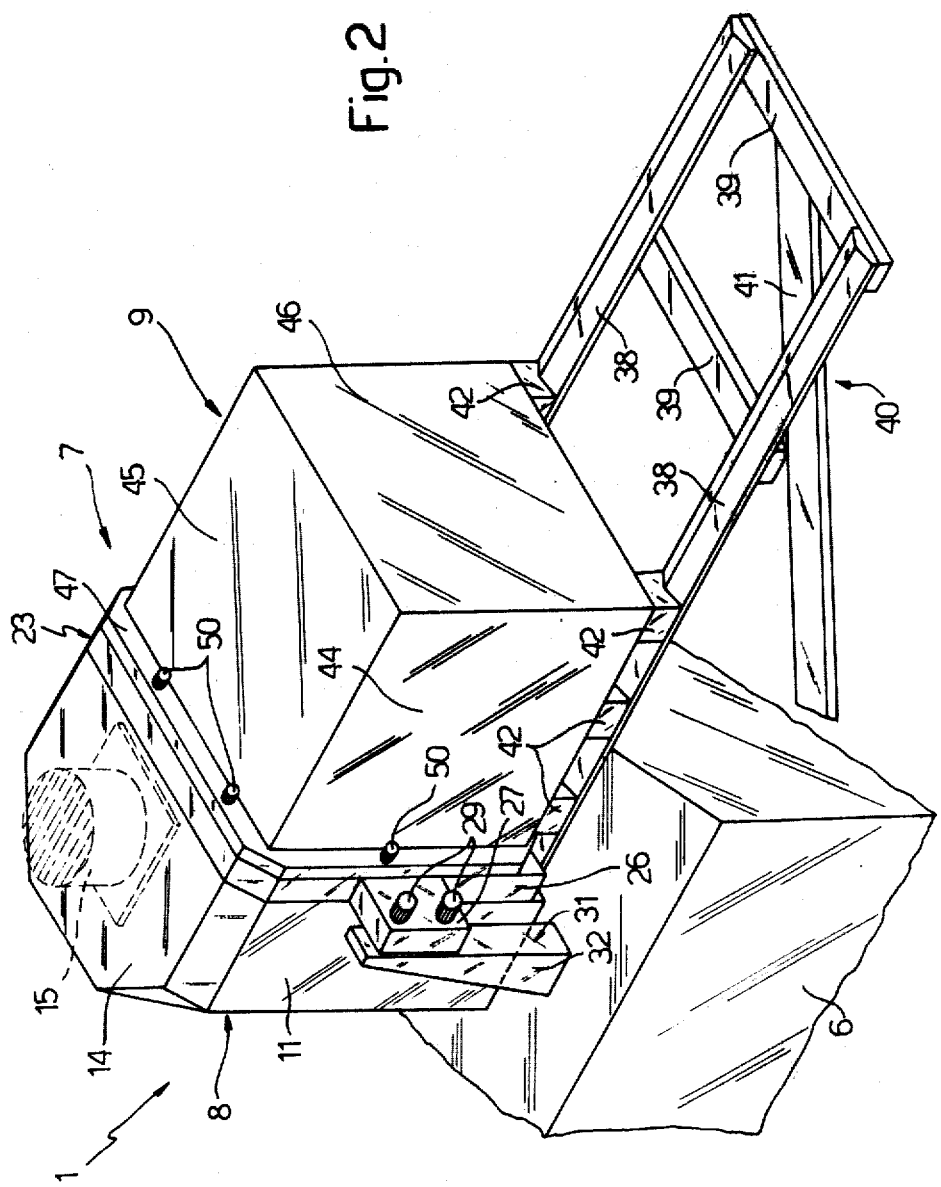
FIG. 2 is a perspective three-quarter view from above of the lower part of the microscope shown in FIG. 1.

Two guides 38 of substantially triangular cross-section are connected to the upper surface of the table 6, and are disposed horizontally and parallel to each other, and extend from the surface 16 outwards perpendicular to said surface 16. The two guides 38 project beyond the free edge of the table 6, and are connected together by cross members 39 which together with the guides 38 form a rigid bracket 40, to the free end of which there is connected a strut 41. As shown in FIG. 1, this latter is constituted by a rod extending obliquely upwards from the frame 4, and rigid therewith.

The two guides 38 slidably support the mobile chamber 9 by way of a plurality of slide blocks 42, which enable the mobile chamber 9 to move along the guides 38 until it comes into contact with the surface 34. The mobile chamber 9 is substantially of cup configuration, with its concavity facing the fixed chamber 8, and comprises a lower wall 43 to the lower surface of which are connected the blocks 42, two substantially vertical side walls 44, a substantially horizontal upper wall, and an end side wall 46. The said walls define a cavity, of which the aperture, facing the fixed chamber 8, is substantially rectangular and is surrounded by a flange 47, the flat annular surface 48 of which is substantially identical to the surface 34, and is arranged to be brought into contact with this latter by moving the chamber 9 along the guides 38.

Through bores 49 aligned with the bores 35 are provided in the flange 47, and are arranged to receive respective screws 50 for centering and possibly locking the flange 47 in contact with the surface 34 of the frame 23. The airtight seal between the surfaces 34 and 48 when in contact is provided by an annular gasket 51 housed in an annular groove provided in the surface 48.

Two guides 52 of substantially triangular cross-section are connected to the upper surface of the lower wall 43 of the mobile chamber 9, their end portions extending outwards from the mobile chamber 9 and being arranged to engage in the grooves 19 of the guides 18 of the fixed chamber 8. Each guide 52 is provided at its vertex with a longitudinal groove 53 extending over the entire relative guide 52, and arranged to slidably support a piece holder, not shown, which can be locked in position on the guides 52, and is adapted to support a piece to be examined.

In the described electron microscope 1, the frame 23 and mobile chamber 9 are mounted only when pieces of large size are to be examined, and only after removing the rotatable door (not shown) which was originally connected to the fixed chamber 8 by the screws 21.

With regard to the frame 23, it should be noted that its use is necessary only when the particular size of the pieces to be examined requires a mobile chamber 9 in which the flange 47, and in particular the surface 48, are of a shape different from the surface 16. In this respect, the only purpose of the frame 23 is to adapt the shape of the flange 47 to the shape of the surface 16.

As the mobile chamber 9 is completely removable, it can be replaced by a plurality of mobile chambers (not shown) having a shape and size chosen each time according to the shape and size of the pieces to be observed, which can then be examined without being subjected to destruction. For example, by using a relatively deep mobile chamber 9, it is possible to observe a gear rigidly connected to a shaft by mounting this latter inside the mobile chamber 9 such that only the gear to be examined projects into the fixed chamber 8. Furthermore, as this latter is not partly occupied by the piece holder, which is completely housed inside the mobile chamber 9, the fixed chamber can accommodate pieces much larger than those which can be mounted on the cantilever-projecting piece holder of the said rotatable door.

When in operation, in order to examine a piece of large dimensions, said rotatable door is firstly removed and a mobile chamber 9 is chosen of dimensions such as to contain the piece to be examined. If the flange 47 of the chosen mobile chamber 9 has a front surface different from the surface 16, a suitable frame 23 is disposed between the chambers 8 and 9, the plate 22 of this frame being connected to the wall 12 of the chamber 8 by the screws 21.

After being mounted, the frame 23 is brought into contact with the surface 16, against which it is locked by moving the mobile chamber 9 along the guides 38. Vacuum is then applied inside the chamber 7 by suction means, not shown, so as to couple together the fixed chamber 8, the frame 23 and the mobile chamber 9 in a perfectly coupled position. At this point, the screws 29 are inserted so as to lock the frame 23 against the fixed chamber 8 in its correct coupled position. Air is then fed into the chamber 7 to enable the mobile chamber 9 to be separated from the frame 23, and to be withdrawn along the guides 38.

All the aforesaid operations are carried out with the chamber 9 empty, and their only purpose is to enable the frame 23 to be perfectly mounted on the fixed chamber 9.

The piece to be examined (not shown) is mounted on the relative piece holder (not shown) by disposing this latter on the outer end of the guides 52. When the piece to be examined has been mounted on the piece holder, this latter is slid along the grooves 53 so that it completely enters the interior of the chamber 9. When the piece holder on the guides 53 has been locked in position by locking screws, not shown, the chamber 9 is slid along the guides 38 until it comes into contact with the surface 34 of the frame 23, and the outer part of its guides 52 is engaged in the grooves 19 of the guides 18 of the fixed chamber 8.

When these operations have been carried out, vacuum is again applied to the interior of the chamber 7 in order to make it possible to observe the piece to be examined. Preferably, before examining the piece, the mobile chamber 9 is centered and fixed in position by means of the screws 50.

Within the principle of the invention, numerous modifications can be made to the described electron microscope without leaving the scope of the inventive idea.

What we claim is:

1. An electron microscope, which comprises;
a base;
a frame supported by said base by way of suspension means;
a vacuum chamber supported by said frame and comprising a first fixed portion and a second portion mobile between a position in which said first portion is open and a position in which said first portion is closed;
an electronic-optical column rigidly connected to said first portion, this latter comprising a fixed cup-shaped body with a lateral aperture arranged to be closed by said second portion, characterised in that said second portion comprises a further interchangeable cup-shaped body with its concavity facing said aperture, and supported by substantially horizontal guide means rigid with said frame for moving from and towards said fixed cup-shaped body;
said second portion further comprising a cornice-shaped member arranged to cooperate in an airtight manner on one side with the open end of said fixed cup-shaped body, and on the other side with the open end of said further cup-shaped body; and
support means being provided inside said further cup-shaped body for supporting a piece holder in an adjustable position.

2. A microscope as claimed in claim 1, characterised in that said cornice-shaped member is hinged laterally to said fixed cup-shaped body so that it rotates relative to this latter about a substantially vertical axis.

3. A microscope as claimed in claim 1, characterised in that said guide means extend along a bracket rigid with said frame.

4. A microscope as claimed in claim 1, characterised in that said support means comprise two guides rigidly connected to said further cup-shaped body.

5. A microscope as claimed in claim 4, characterised in that said two guides each comprise a terminal portion projecting from the open end of said further cup-shaped body, and slidably engaged in a respective groove carried by said fixed cup-shaped body.

6. A microscope as claimed in claim 5, characterised in that each of said grooves is provided longitudinally in a respective guide element rigidly connected to said fixed cup-shaped body.

* * * * *